US012666702B2

(12) United States Patent
Chen et al.

(10) Patent No.: US 12,666,702 B2
(45) Date of Patent: Jun. 23, 2026

(54) SEMICONDUCTOR DEVICE AND FABRICATING METHOD OF THE SAME

(71) Applicant: UNITED MICROELECTRONICS CORP., Hsin-Chu City (TW)

(72) Inventors: Hsin-Hsien Chen, New Taipei City (TW); Sheng-Yuan Hsueh, Tainan City (TW); Kun-Szu Tseng, Tainan City (TW); Kuo-Hsing Lee, Hsinchu County (TW); Chih-Kai Kang, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 372 days.

(21) Appl. No.: 18/212,188

(22) Filed: Jun. 21, 2023

(65) Prior Publication Data

US 2024/0387523 A1      Nov. 21, 2024

(30) Foreign Application Priority Data

May 16, 2023      (TW) ................................. 112118029

(51) Int. Cl.
  H10D 84/83          (2025.01)
  H10D 30/62          (2025.01)
          (Continued)

(52) U.S. Cl.
  CPC ............. H10D 84/83 (2025.01); H10D 30/62 (2025.01); H10D 30/65 (2025.01);
          (Continued)

(58) Field of Classification Search
  CPC ........ H10D 84/83; H10D 30/62; H10D 30/65;

H10D 62/116; H10D 64/252; H10D 64/514; H10D 84/0149; H10D 84/038; H10D 84/013; H10D 84/0151; H10D 84/0158; H10D 84/834
See application file for complete search history.

(56)          References Cited

U.S. PATENT DOCUMENTS 6,716,708 B2      4/2004   Cabral
  10,090,410 B1    10/2018   Chi
          (Continued)

OTHER PUBLICATIONS

Hsu, the specification, including the claims, and drawings in the U.S. Appl. No. 17/668,393 , filed Feb. 10, 2022.

*Primary Examiner* — Marlon T Fletcher
*Assistant Examiner* — Da Wei Lee
(74) *Attorney, Agent, or Firm* — Winston Hsu

(57)          ABSTRACT

A semiconductor device includes a substrate. A high voltage transistor is disposed within a high voltage region of the substrate. The high voltage transistor includes a first gate dielectric layer disposed on the substrate. A first gate electrode is disposed on the first gate dielectric layer. A first source/drain doping region and a second source/drain doping region are respectively disposed in the substrate at two sides of the first gate electrode. A first silicide layer covers and contacts the first source/drain doping region and a second silicide layer covers and contacts the second source/drain doping region. A first conductive plate penetrates the first silicide layer and contacts the first source/drain doping region. A second conductive plate penetrates the second silicide layer and contacts the second source/drain doping region.

18 Claims, 3 Drawing Sheets

(51) Int. Cl.

| | | |
|---|---|---|
| *H10D 30/65* | (2025.01) | |
| *H10D 62/10* | (2025.01) | |
| *H10D 64/23* | (2025.01) | |
| *H10D 64/27* | (2025.01) | |
| *H10D 84/01* | (2025.01) | |
| *H10D 84/03* | (2025.01) | |

(52) U.S. Cl.
CPC ......... *H10D 62/116* (2025.01); *H10D 64/252* (2025.01); *H10D 64/514* (2025.01); *H10D 84/0149* (2025.01); *H10D 84/038* (2025.01)

(56) References Cited

U.S. PATENT DOCUMENTS

| | | | |
|---|---|---|---|
| 2004/0219760 A1* | 11/2004 | Chaine ................. | H10D 89/811 |
| | | | 438/400 |
| 2013/0295765 A1* | 11/2013 | Alptekin ............ | H10D 64/0112 |
| | | | 438/664 |
| 2015/0021687 A1* | 1/2015 | Tamura ................. | H10D 30/65 |
| | | | 438/424 |
| 2015/0278428 A1* | 10/2015 | Wang .................... | G06F 30/398 |
| | | | 716/112 |
| 2023/0290864 A1* | 9/2023 | Jourba ................. | H10D 30/024 |

* cited by examiner

SEMICONDUCTOR DEVICE AND FABRICATING METHOD OF THE SAME

BACKGROUND OF THE INVENTION

1. Field of the Invention

The present invention relates to a high voltage transistor, and more particularly to a high voltage transistor which has a silicide layer on a source/drain doping region.

2. Description of the Prior Art

In current semiconductor processing, controllers, memories, circuits of low-voltage operation and power devices of high-voltage operation are largely integrated into a single chip to achieve a single-chip system. The power device, such as vertical double-diffusion metal-oxide-semiconductor (VDMOS), insulated gate bipolar transistor (IGBT) and lateral diffusion MOS (LDMOS), is employed to increase power switching efficiency and decrease the loss of energy resources. It is often required that the switching transistors withstand high breakdown voltages and operate at a low on-resistance.

Moreover with the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However as the scale of current devices continue to decrease, the integration of high-voltage devices and Fin-FET devices start to face numerous challenges. Therefore, a new high voltage transistor structure with improved function is needed

SUMMARY OF THE INVENTION

In view of this, a silicide layer is disposed on a source/drain doping region to decrease on-resistance of a high voltage transistor.

According to a preferred embodiment of the present invention, a semiconductor device includes a substrate including a high voltage region and a low voltage region. A first deep trench isolation and a second deep trench isolation are embedded in the substrate within the high voltage region. A high voltage transistor is disposed within the high voltage region, wherein the high voltage transistor includes a first gate dielectric layer disposed on a first surface of the substrate, wherein the first gate dielectric layer is between the first deep trench isolation and the second deep trench isolation, and the first gate dielectric layer contacts the first deep trench isolation and the second deep trench isolation. A first gate electrode is disposed on the first gate dielectric layer. A first source/drain doping region is disposed within the substrate at one side of the first deep trench isolation, wherein the first source/drain doping region contacts the first deep trench isolation. A second source/drain doping region is disposed within the substrate at one side of the second deep trench isolation, wherein the second source/drain doping region contacts the second deep trench isolation. A first silicide layer covers and contacts the first source/drain doping region. A second silicide layer covers and contacts the second source/drain doping region. A first conductive plate penetrates the first silicide layer and contacts the first source/drain doping region. A second conductive plate penetrates the second silicide layer and contacts the second source/drain doping region. A fin transistor is disposed within the low voltage region, wherein the fin transistor includes a fin structure protrudes from a second surface of the substrate. A second gate electrode is disposed on the fin structure. Two shallow trench isolations are disposed at two sides of the fin structure.

A fabricating method of a semiconductor device includes providing a substrate divided into a high voltage region and a low voltage region. Then, a first deep trench isolation and a second deep trench isolation are formed to be embedded in the substrate within the high voltage region. Later, a high voltage transistor is formed to be disposed within the high voltage region, wherein the high voltage transistor includes a first gate dielectric layer disposed on a first surface of the substrate, wherein the first gate dielectric layer is between the first deep trench isolation and the second deep trench isolation, and the first gate dielectric layer contacts the first deep trench isolation and the second deep trench isolation. A first gate electrode is disposed on the first gate dielectric layer. A first source/drain doping region is disposed within the substrate at one side of the first deep trench isolation, wherein the first source/drain doping region contacts the first deep trench isolation. A second source/drain doping region is disposed within the substrate at one side of the second deep trench isolation, wherein the second source/drain doping region contacts the second deep trench isolation. A first silicide layer covers and contacts the first source/drain doping region. A second silicide layer covers and contacts the second source/drain doping region. A first conductive plate penetrates the first silicide layer and contacts the first source/drain doping region. A second conductive plate penetrates the second silicide layer and contacts the second source/drain doping region. After that, a fin transistor is formed to be disposed within the low voltage region, wherein the fin transistor includes a fin structure protrudes from a second surface of the substrate. A second gate electrode is disposed on the fin structure. Two shallow trench isolations are disposed at two sides of the fin structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
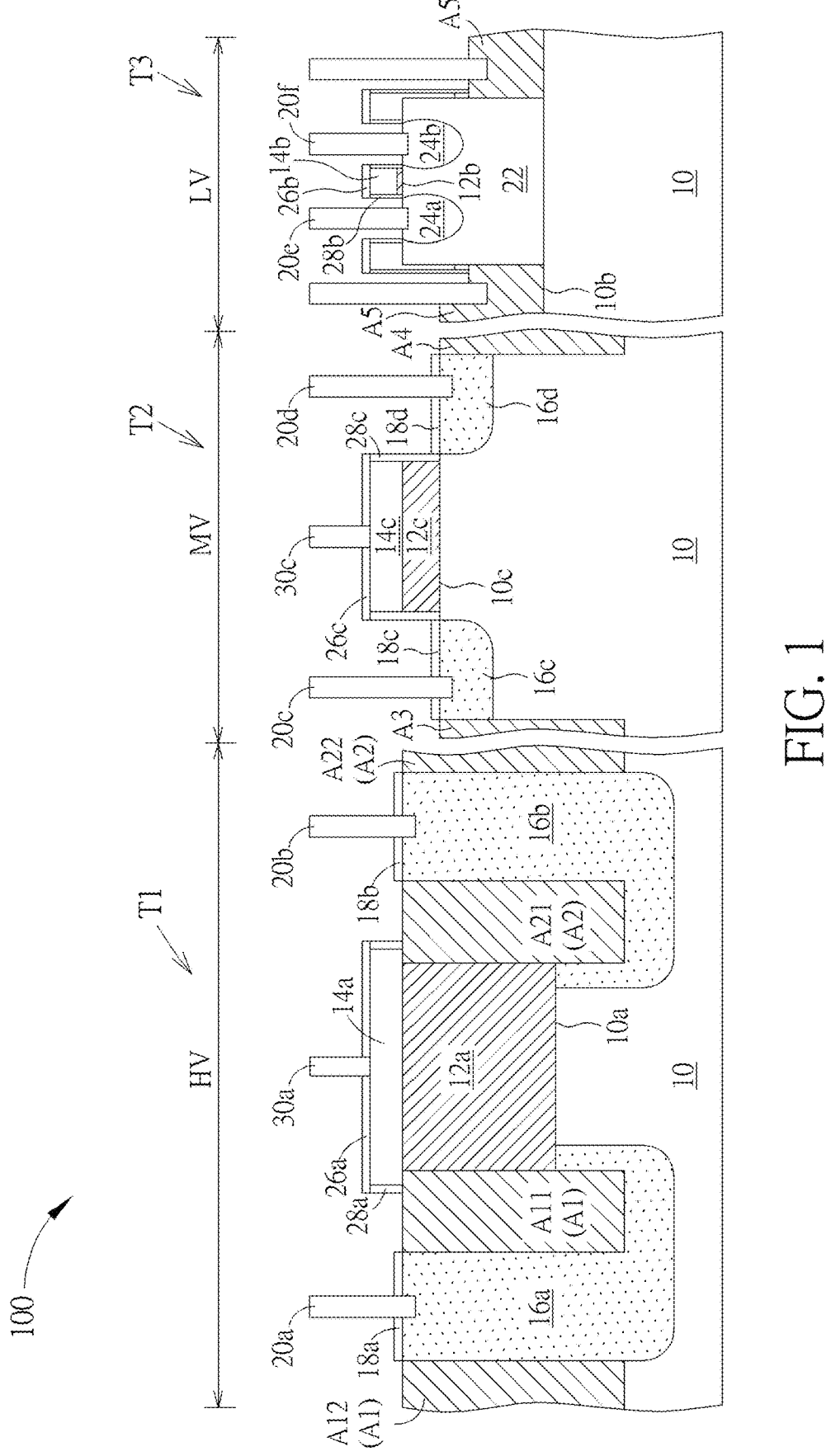
FIG. 1 depicts a semiconductor device according to a preferred embodiment of the present invention.

FIG. 1 depicts a semiconductor device according to a preferred embodiment of the present invention.

As shown in FIG. 1, a semiconductor device 100 includes a substrate 10. The substrate 10 includes a high voltage region HV, a middle voltage region MV and a low voltage region LV. A first deep trench isolation A1 and a second deep trench isolation A2 are embedded in the substrate 10 within the high voltage region HV. The first deep trench isolation A1 and the second deep trench isolation A2 are respectively formed by a deep trench filling with an insulating layer. The top surface of the first deep trench isolation A1 and the top surface of the second deep trench isolation A2 are aligned with each other. A high voltage transistor T1 is disposed within the high voltage region HV. A middle voltage transistor T2 is disposed within the middle voltage region MV. A fin transistor T3 is disposed within the low voltage region LV. The high voltage transistor HV includes a first gate dielectric layer 12a disposed on a first surface 10a of the substrate 10. The first gate dielectric layer 12a is between the first deep trench isolation A1 and the second deep trench isolation A2, and the first gate dielectric layer 12a contacts the first deep trench isolation A1 and the second deep trench isolation A2. Furthermore, a top surface of the first gate dielectric layer 12a is preferably aligned with a top surface of the first deep trench isolation A1 and a top surface of the second deep trench isolation A2. The first gate dielectric layer 12 includes silicon oxide. A first gate electrode 14a is disposed on the first gate dielectric layer 12a. The first gate electrode 14a preferably contacts a top surface of the first deep trench isolation A1 and a top surface of the second deep trench isolation A2. The first gate electrode 14a preferably includes a gate formed by polysilicon and a spacer 28a disposed at two sides of the gate. The gate can be formed by other semiconductor materials or metals. A first source/drain doping region 16a is disposed within the substrate 10 at one side of the first deep trench isolation A1 and the first source/drain doping region 16a contacts the first deep trench isolation A1. A second source/drain doping region 16b is disposed within the substrate 10 at one side of the second deep trench isolation A2, and the second source/drain doping region 16b contacts the second deep trench isolation A2. That is, the first source/drain doping region 16a and the first gate dielectric layer 12a are separated by the first deep trench isolation A1. The second source/drain doping region 16b and the first gate dielectric layer 12a are separated by the second deep trench isolation A2. A first silicide layer 18a covers and contacts the first source/drain doping region 16a. A second silicide layer 18b covers and contacts the second source/drain doping region 16b. A first conductive plate 20a penetrates the first silicide layer 18a and contacts the first source/drain doping region 16a. A second conductive plate 20b penetrates the second silicide layer 18b and contacts the second source/drain doping region 16b. Moreover, there is no epitaxial layer within the first source/drain doping region 16a or the second source/drain doping region 16b, and there is no epitaxial layer on the surface of the first source/drain doping region 16a or the surface of the second source/drain doping region 16b.

The middle voltage transistor T2 includes a second gate dielectric layer 12c disposed at a third surface 10c of the substrate 10. The second gate dielectric layer 12c includes silicon oxide. A third gate electrode 14c is disposed on the second gate dielectric layer 12c. The third gate electrode 14c preferably includes a gate formed by polysilicon and a spacer 28c disposed at two sides of the gate. The gate can be formed by other semiconductor materials or metals. A third source/drain doping region 16c is disposed within the substrate 10 at one side of the third gate electrode 14c. A fourth source/drain doping region 16d is disposed within the substrate 10 at another side of the third gate electrode 14c. A third silicide layer 18c covers and contacts the third source/drain doping region 16c. A fourth silicide layer 18d covers and contacts the fourth source/drain doping region 16d. A third conductive plate 20c penetrates the third silicide layer 18c and contacts the third source/drain doping region 16c. A fourth conductive plate 20d penetrates the fourth silicide layer 18d and contacts the fourth source/drain doping region 16d. Moreover, a third deep trench isolation A3 and a fourth deep trench isolation A4 are disposed in the substrate 10 at two sides of the middle voltage transistor T2 to define an active region for the middle voltage transistor T2.

The fin transistor T3 includes a fin structure 22 protrudes from a second surface 10b of the substrate 10. A second gate electrode 14b is disposed on the fin structure 22. Two shallow trench isolations A5 are disposed at two sides of the fin structure 22. The second gate electrode 14b preferably includes a gate formed by polysilicon and a spacer 28b disposed at two sides of the gate. The gate formed by polysilicon can be replaced by a metal gate. A third gate dielectric layer 12b is disposed between the fin structure 22 and the second gate electrode 14b. A first epitaxial layer 24a and a second epitaxial layer 24b are respectively embedded within the fin structure 22 at two sides of the second gate electrode 14b. There is no silicide on the top surfaces of the first epitaxial layer 24a and on the second epitaxial layer 24b. A fifth conductive plate 20e and a sixth conductive plate 20f respectively contacts the first epitaxial layer 24a and the second epitaxial layer 24b. The fifth conductive plate 20e and the sixth conductive plate 20f are both in a shape of a strip. Moreover, the second surface 10b is lower than the third surface 10c. The first surface 10a is lower than the third surface 10e. A depth of the shallow trench isolation A5 is smaller than a depth of the first deep trench isolation A1. The first conductive plate 20a, the second conductive plate 20b, the third conductive plate 20c, the fourth conductive plate 20d and the fifth conductive plate 20e and the sixth conductive plate 20f are preferably metal, alloy or silicide.

Furthermore, a cap layer 26a, a cap layer 26c, a cap layer 26b respectively cover a top surface of the first gate electrode 14a, a top surface of the third gate electrode 14c and a top surface of the second gate electrode 14b. A first gate conductive plate 30a contacts the first gate electrode 14a and a second gate conductive plate 30c contacts the third gate electrode 14c.

Figure 2:
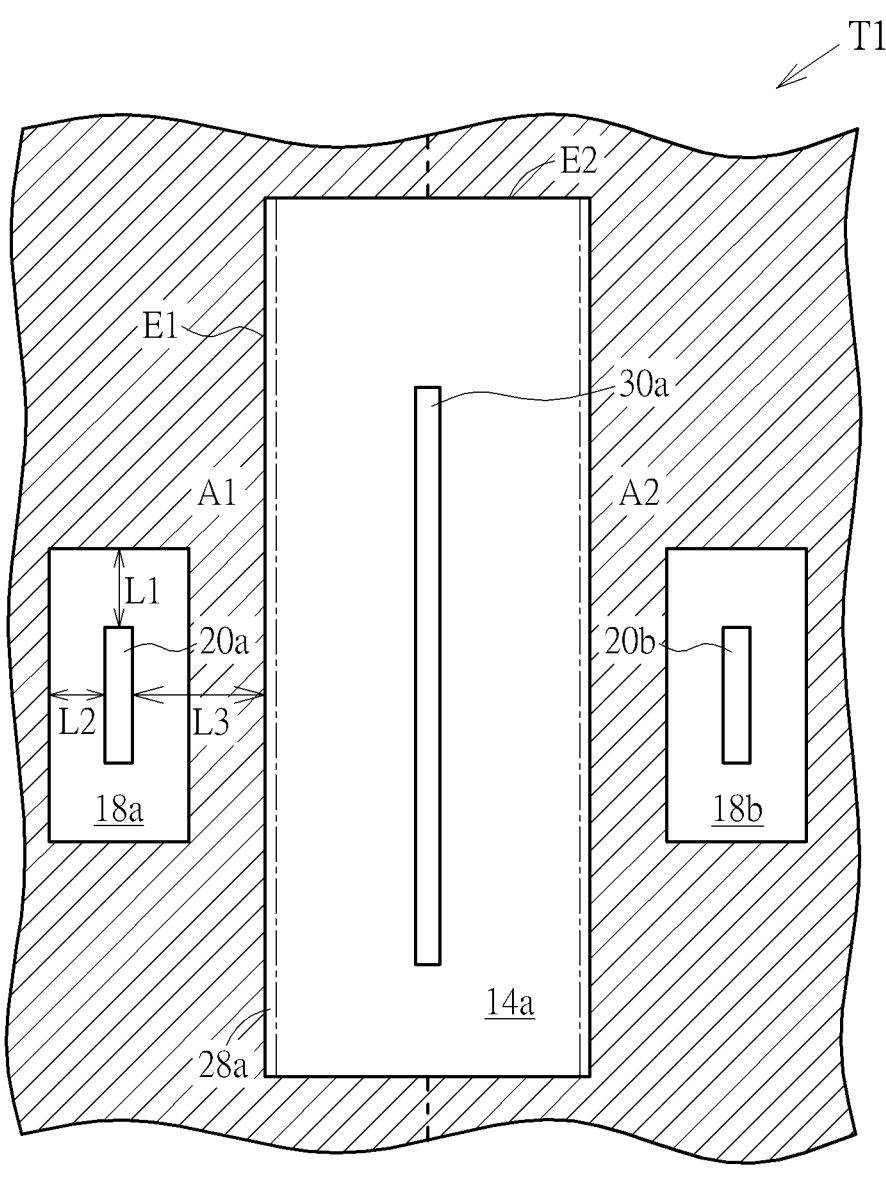
FIG. 2 depicts a top view of a high voltage transistor in FIG. 1.
Figure 2:
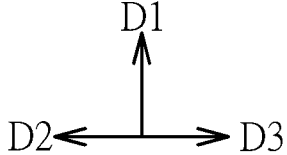
Figure 3:
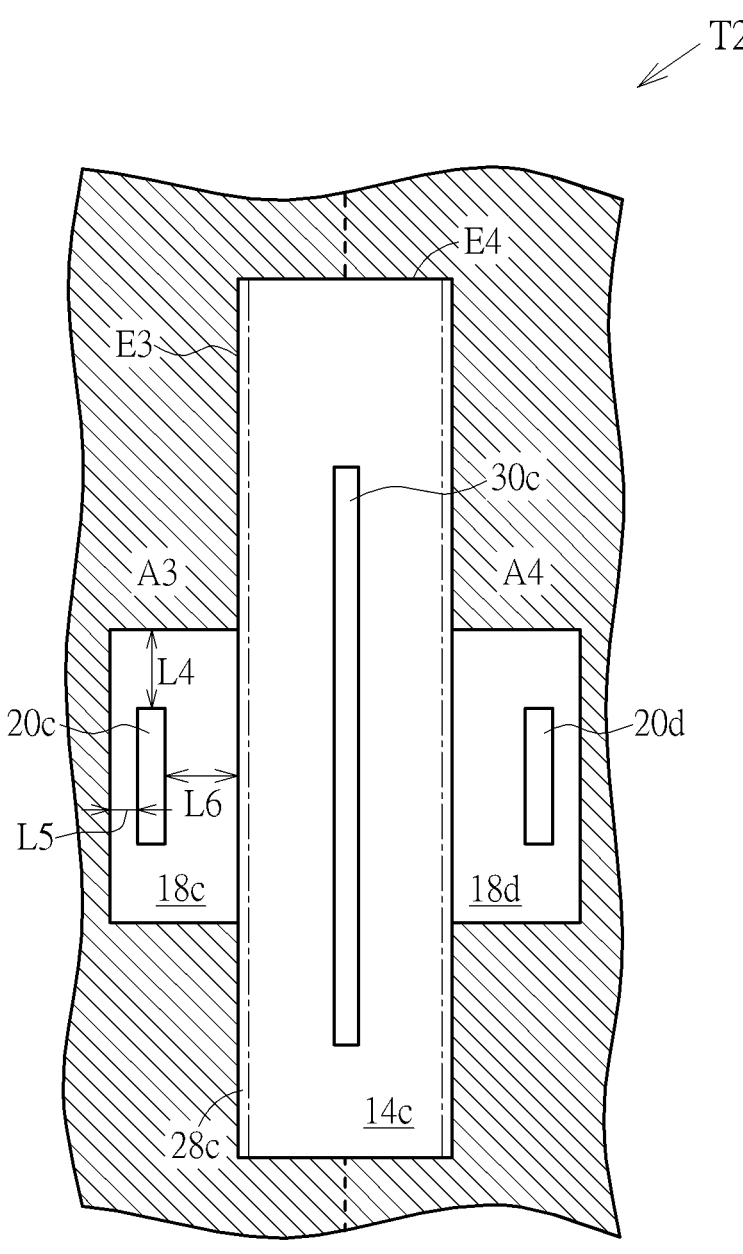
FIG. 3 depicts a top view of a middle voltage transistor in FIG. 1.
Figure 3:
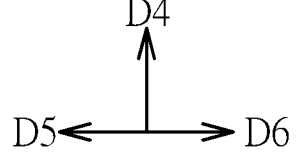

FIG. 2 depicts a top view of a high voltage transistor in FIG. 1. FIG. 3 depicts a top view of a middle voltage transistor in FIG. 1. In FIG. 2 and FIG. 3, elements which are substantially the same as those in the embodiment of FIG. 1 are denoted by the same reference numerals; an accompanying explanation is therefore omitted.

Please refer to FIG. 1 and FIG. 2. There is only the first conductive plate 20a penetrates the first silicide layer 18a on the first source/drain doping region 16a, and there are no other conductive elements penetrating the first silicide layer 18a. The first conductive plate 20a directly contacts the first source/drain doping region 16a. Furthermore, there is only the second conductive plate 20b penetrates the second silicide layer 18b on the second source/drain doping region 16b, and there are no other conductive elements penetrating the second silicide layer 18b. The second conductive plate 20b directly contacts the second source/drain doping region 16b. That is, the first source/drain doping region 16a electrically connects to outside signal by only one physical contact, i.e. the physical contact with the first conductive plate 20a. The second source/drain doping region 16b electrically connects to outside signal by only one physical contact, i.e. the physical contact with the second conductive plate 20b. The first conductive plate 20a and the second conductive plate 20b are preferably in a shape of a strip. Moreover, in FIG. 2, the first deep trench isolation A1 and the second deep trench isolation A2 are separated by dotted lines; however the first deep trench isolation A1 actually connects to the second deep trench isolation A2.

Moreover, as shown in FIG. 2, when view from a top view, a first direction D1 is parallel with a long side E1 of the first gate electrode 14a, a second direction D2 is parallel with a short side E2 of the first gate electrode 14a, a third direction D3 is parallel with the short side E2 of the first gate electrode 14a and the third direction D3 is in reverse direction of the second direction D2. According to a preferred embodiment of the present invention, along the first direction D1, a shortest distance L1 between the first conductive plate 20a and an edge of the first silicide layer 18a is between 10 and 90 nanometers. Along the second direction D2, a shortest distance L2 between the first conductive plate 20a and an edge of the first silicide layer 18a is between 10 and 90 nanometers. Along the third direction D3, a shortest distance L3 between the first conductive plate 20a and the first gate electrode 14a is between 350 and 1050 nanometers. By taking the first gate electrode 14a as a symmetrical line, the first conductive plate 20a is symmetrical to the second conductive plate 20b. The first silicide layer 18a is symmetrical to the second silicide layer 18b. Therefore, a relative position between the second conductive plate 20b and the second silicide layer 18b is the same as a relative position between the first conductive plate 20a and the first silicide layer 18a. Therefore, the detailed description of the relative position between the second conductive plate 20b and the second silicide layer 18b is omitted. According to a preferred embodiment of the present invention, the range of the shortest distance L1, the shortest distance L2 and the shortest distance L3 are especially suitable for the high voltage transistor applied in 40 volts. For the high voltage transistor applied in other volts, such as 8 volts or 12 volts, the range of the shortest distance L1, the shortest distance L2 and the shortest distance L3 are needed to be adjusted.

As shown in FIG. 1 and FIG. 3, in the middle voltage transistor T2, there is only the third conductive plate 20c penetrates the third silicide layer 18c on the third source/drain doping region 16c, and there are no other conductive elements penetrating the third silicide layer 18c. There is only the fourth conductive plate 20d penetrates the fourth silicide layer 18d on the fourth source/drain doping region 16d, and there are no other conductive elements penetrating the fourth silicide layer 18d. That is, the third source/drain doping region 16c electrically connects to outside signal by only one physical contact, i.e. the physical contact with the third conductive plate 20c. The fourth source/drain doping region 16d electrically connects to outside signal by only one physical contact, i.e. the physical contact with the fourth conductive plate 20d. The third conductive plate 20c and the fourth conductive plate 20d are preferably in a shape of a strip. Moreover, in FIG. 3, the third deep trench isolation A3 and the fourth deep trench isolation A4 are separated by dotted lines; however the third deep trench isolation A3 actually connects to the fourth deep trench isolation A4.

Moreover, a fourth direction D4 is parallel to a long side E3 of the second gate electrode 14c. A fifth direction D5 is parallel to a short side E1 of the second gate electrode 14c. A sixth direction D6 is parallel with the short side E4 of the second gate electrode 14c and the sixth direction D6 is in reverse direction of the fifth direction D5. According to a preferred embodiment of the present invention, along the fourth direction D4, a shortest distance L4 between the third conductive plate 20c and an edge of the third silicide layer 18c is between 5 and 55 nanometers. Along the fifth direction D5, a shortest distance L5 between the third conductive plate 20c and an edge of the third silicide layer 18c is between 5 and 35 nanometers. Along the sixth direction D6, a shortest distance L6 between the third conductive plate 20c and the second gate electrode 14c is between 40 and 140 nanometers. By taking the second gate electrode 14c as a symmetrical line, the third conductive plate 20c is symmetrical to the fourth conductive plate 20d. The third silicide layer 18c is symmetrical to the fourth silicide layer 18d. Therefore, a relative position between the fourth conductive plate 20d and the fourth silicide layer 18d is the same as a relative position between the third conductive plate 20c and the third silicide layer 18c. Therefore, the detailed description of the relative position between the fourth conductive plate 20d and the fourth silicide layer 18d is omitted.

As shown in FIG. 1, a fabricating method of a semiconductor device including providing a substrate 10. The substrate 10 is divided into a high voltage region HV, a middle voltage region MV and a low voltage region LV. After that, a first deep trench isolation A1 and a second deep trench isolation A2 are formed to embedded in the substrate 10 within the high voltage region HV. Later, a high voltage transistor T1 is formed within the high voltage region HV, a middle voltage transistor T2 is formed within the middle voltage region MV, and a fin transistor T3 is formed within the low voltage transistor LV.

The high voltage transistor T1 includes a first gate dielectric layer 12a disposed on a first surface 10a of the substrate 10. The first gate dielectric layer 12a is between a first part A11 of the first deep trench isolation A1 and a first part A21 of the second deep trench isolation A2, and the first gate dielectric layer 12a contacts the first deep trench isolation A1 and the second deep trench isolation A2. A first gate electrode 14a is disposed on the first gate dielectric layer 12a. A first source/drain doping region 16a is disposed within the substrate 10 at one side of the first deep trench isolation A1, wherein the first source/drain doping region 16a contacts the first deep trench isolation A1. A second part A12 of the first deep trench isolation A1 defines an outer edge of the first source/drain doping region 16a, the first part A11 of the first deep trench isolation A1 is embedded within the first source/drain doping region 16a, and a bottom of the first part A11 of the first deep trench isolation A1 is aligned with a bottom of the second part A12 of the first deep trench isolation A1. A second source/drain doping region 16b is disposed within the substrate 10 at one side of the second deep trench isolation A2, wherein the second source/drain doping region 16b contacts the second deep trench isolation A2. A second part A22 of the second deep trench isolation A2 defines an outer edge of the second source/drain doping region 16b, the first part A21 of the second deep trench isolation A2 is embedded within the second source/drain doping region 16b, and a bottom of the first part A21 of the second deep trench isolation A2 is aligned with a bottom of the second part A22 of the second deep trench isolation A2. A first silicide layer 18a covers and contacts the first source/drain doping region 16a. A second silicide layer 18b covers and contacts the second source/drain doping region 18b. A first conductive plate 20a penetrates the first silicide layer 18a and contacts the first source/drain doping region 16a. A second conductive plate 20b penetrates the second silicide layer 18b and contacts the second source/drain doping region 16b.

The middle voltage transistor T2 includes a second gate dielectric layer 12c disposed at a third surface 10c of the substrate 10. A third gate electrode 14c is disposed on the second gate dielectric layer 12c. A third source/drain doping region 16c is disposed within the substrate 10 at one side of the third gate electrode 14c. A fourth source/drain doping region 16d is disposed within the substrate 10 at another side of the third gate electrode 14c. A third silicide layer 18c covers and contacts the third source/drain doping region 16c. A fourth silicide layer 18d covers and contacts the fourth source/drain doping region 16d. A third conductive plate 20c penetrates the third silicide layer 18c and contacts the third source/drain doping region 16c. A fourth conductive plate 20d penetrates the fourth silicide layer 18d and contacts the fourth source/drain doping region 16d.

The fin transistor T3 includes a fin structure 22 protrudes from a second surface 10b of the substrate 10. A second gate electrode 14b is disposed on the fin structure 22. Two shallow trench isolations A5 are disposed at two sides of the fin structure 22. A third gate dielectric layer 12b is disposed between the fin structure 22 and the second gate electrode 14b. A first epitaxial layer 24a and a second epitaxial layer 24b are respectively embedded within the fin structure 22 at two sides of the second gate electrode 14b. A fifth conductive plate 20e and a sixth conductive plate 20f respectively contacts the first epitaxial layer 24a and the second epitaxial layer 24b. Now, a semiconductor device 100 of the present invention is completed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
a substrate comprising a high voltage region and a low voltage region;
a first deep trench isolation and a second deep trench isolation embedded in the substrate within the high voltage region;
a high voltage transistor disposed within the high voltage region, wherein the high voltage transistor comprises:
a first gate dielectric layer disposed on a first surface of the substrate, wherein the first gate dielectric layer is between a first part of the first deep trench isolation and a first part of the second deep trench isolation, the first gate dielectric layer contacts the first deep trench isolation and the second deep trench isolation, and a top surface of the first gate dielectric layer is aligned with a top surface of the first deep trench isolation and a top surface of the second deep trench isolation;
a first gate electrode disposed on the first gate dielectric layer;
a first source/drain doping region disposed within the substrate, wherein a second part of the first deep trench isolation defines an outer edge of the first source/drain doping region, the first part of the first deep trench isolation is embedded within the first source/drain doping region, and a bottom of the first part of the first deep trench isolation is aligned with a bottom of the second part of the first deep trench isolation;
a second source/drain doping region disposed within the substrate, wherein a second part of the second deep trench isolation defines an outer edge of the second source/drain doping region, the first part of second deep trench isolation is embedded within the second source/drain doping region, and a bottom of the first part of the second deep trench isolation is aligned with a bottom of the second part of the second deep trench isolation;
a first silicide layer covering and contacting the first source/drain doping region; and
a second silicide layer covering and contacting the second source/drain doping region;
a first conductive plate penetrating the first silicide layer and contacting the first source/drain doping region, wherein as seen from a top view, only the first conductive plate penetrates the first silicide layer on the first source/drain doping region, and no other conductive elements penetrate the first silicide layer; and
a second conductive plate penetrating the second silicide layer and contacting the second source/drain doping region;
a fin transistor disposed within the low voltage region, wherein the fin transistor comprises:
a fin structure protruding from a second surface of the substrate;
a second gate electrode disposed on the fin structure; and
two shallow trench isolations disposed at two sides of the fin structure.

2. The semiconductor device of claim 1, wherein a first direction is parallel with a long side of the first gate electrode, a second direction is parallel with a short side of the first gate electrode, a third direction is parallel with the short side of the first gate electrode and the third direction is in a reverse direction of the second direction.

3. The semiconductor device of claim 2, wherein along the first direction, a shortest distance between the first conductive plate and an edge of the first silicide layer is between 10 and 90 nanometers.

4. The semiconductor device of claim 2, wherein along the second direction, a shortest distance between the first conductive plate and an edge of the first silicide layer is between 10 and 90 nanometers.

5. The semiconductor device of claim 2, wherein along the third direction, a shortest distance between the first conductive plate and the first gate electrode is between 350 and 1050 nanometers.

6. The semiconductor device of claim 1, wherein a depth of each of the two shallow trench isolations is smaller than a depth of the first deep trench isolation.

7. The semiconductor device of claim 1, wherein there is no epitaxial layer on the first source/drain doping region and the second source/drain doping region.

8. The semiconductor device of claim 1, wherein a voltage of the high voltage transistor is 40 volts.

9. The semiconductor device of claim 1, further comprising a first epitaxial layer and a second epitaxial layer respectively embedded within the fin structure at two sides of the second gate electrode.

10. A fabricating method of a semiconductor device, comprising:
providing a substrate comprising a high voltage region and a low voltage region;
forming a first deep trench isolation and a second deep trench isolation embedded in the substrate within the high voltage region;
forming a high voltage transistor disposed within the high voltage region, wherein the high voltage transistor comprises 9 10 a first gate dielectric layer disposed on a first surface of the substrate, wherein the first gate dielectric layer is between a first part of the first deep trench isolation and a first part of the second deep trench isolation, the first gate dielectric layer contacts the first deep trench isolation and the second deep trench isolation, and a top surface of the first gate dielectric layer is aligned with a top surface of the first deep trench isolation and a top surface of the second deep trench isolation;

a first gate electrode disposed on the first gate dielectric layer;

a first source/drain doping region disposed within the substrate, wherein a second part of the first deep trench isolation defines an outer edge of the first source/drain doping region, the first part of the first deep trench isolation is embedded within the first source/drain doping region, and a bottom of the first part of the first deep trench isolation is aligned with a bottom of the second part of the first deep trench isolation;

a second source/drain doping region disposed within the substrate, wherein a second part of the second deep trench isolation defines an outer edge of the second source/drain doping region, the first part of second deep trench isolation is embedded within the second source/drain doping region, and a bottom of the first part of the second deep trench isolation is aligned with a bottom of the second part of the second deep trench isolation;

a first silicide layer covering and contacting the first source/drain doping region;

a second silicide layer covering and contacting the second source/drain doping region; and a first conductive plate penetrating the first silicide layer and contacting the first source/drain doping region, wherein as seen from a top view, only the first conductive plate penetrates the first silicide layer on the first source/drain doping region, and no other conductive elements penetrate the first silicide layer; and a second conductive plate penetrating the second silicide layer and contacting the second source/drain doping region;

forming a fin transistor disposed within the low voltage region, wherein the fin transistor comprises:

a fin structure protruding from a second surface of the substrate;

a second gate electrode disposed on the fin structure; and two shallow trench isolations disposed at two sides of the fin structure.

11. The fabricating method of a semiconductor device of claim 10, wherein a first direction is parallel with a long side of the first gate electrode, a second direction is parallel with a short side of the first gate electrode, a third direction is parallel with the short side of the first gate electrode and the third direction is in a reverse direction of the second direction.

12. The fabricating method of a semiconductor device of claim 11, wherein along the first direction, a shortest distance between the first conductive plate and an edge of the first silicide layer is between 10 and 90 nanometers.

13. The fabricating method of a semiconductor device of claim 11, wherein along the second direction, a shortest distance between the first conductive plate and an edge of the first silicide layer is between 10 and 90 nanometers.

14. The fabricating method of a semiconductor device of claim 11, wherein along the third direction, a shortest distance between the first conductive plate and the first gate electrode is between 350 and 1050 nanometers.

15. The fabricating method of a semiconductor device of claim 10, wherein a depth of each of the two shallow trench isolations is smaller than a depth of the first deep trench isolation.

16. The fabricating method of a semiconductor device of claim 10, wherein there is no epitaxial layer on the first source/drain doping region and the second source/drain doping region.

17. The fabricating method of a semiconductor device of claim 10, wherein a voltage of the high voltage transistor is 40 volts.

18. The fabricating method of a semiconductor device of claim 10, further comprising a first epitaxial layer and a second epitaxial layer respectively embedded within the fin structure at two sides of the second gate electrode.

* * * * *